(12) United States Patent
Ishikawa et al.

(10) Patent No.: US 7,737,761 B2
(45) Date of Patent: Jun. 15, 2010

(54) GATE DRIVE CIRCUIT WITH REDUCED SWITCHING LOSS AND NOISE

(75) Inventors: Katsumi Ishikawa, Hitachinaka (JP); Masahiro Nagasu, Hitachinaka (JP); Dai Tsugawa, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/019,032

(22) Filed: Jan. 24, 2008

(65) Prior Publication Data

US 2008/0122497 A1 May 29, 2008

Related U.S. Application Data

(63) Continuation of application No. PCT/JP2007/069229, filed on Oct. 2, 2007.

(30) Foreign Application Priority Data

Oct. 2, 2006 (JP) ............................. 2006-270502

(51) Int. Cl.
*H03K 17/16* (2006.01)
*H03K 17/30* (2006.01)
(52) U.S. Cl. ................... 327/380; 327/170; 327/381; 327/387; 327/434; 361/100
(58) Field of Classification Search ................. 327/170, 327/380, 381, 387, 434; 361/100
See application file for complete search history.

(56) References Cited

U.S. PATENT DOCUMENTS 6,271,709 B1 * 8/2001 Kimura et al. ............... 327/380

2005/0146823 A1 * 7/2005 Sakata et al. ................ 361/100

FOREIGN PATENT DOCUMENTS

| JP | 6-291631 A | 10/1994 |
| JP | 10-32976 A | 2/1998 |
| JP | 2000-83371 A | 3/2000 |
| JP | 2000-228868 | 8/2000 |
| JP | 2001-245479 | 9/2001 |
| JP | 2001-1269875 | 10/2001 |
| JP | 2006-158185 A | 6/2006 |

OTHER PUBLICATIONS

International Search Report.
Hirofumi Irokawa et al., "Power Loss Limit Analysis Method for High Output-Power-Density Converters by a Pair of Si-Mosfet with SiC-SBD", EDD-05-46, SPC-05-71, pp. 1-11.
International Search Report dated Dec. 25, 2007 (Two (2) pages).
International Preliminary Report dated Apr. 22, 2009 with translation of the Written Opinion of the International Searching Authority (Six (6) pages).

* cited by examiner

*Primary Examiner*—Lincoln Donovan
*Assistant Examiner*—John W Poos
(74) *Attorney, Agent, or Firm*—Crowell & Moring, LLP

(57) ABSTRACT

A subject of the present invention is to reduce noise caused by ringing or the like while reducing turn-on power loss of the element and reverse recovery loss of the diode in a switching circuit of a power semiconductor element to which a SiC diode having small recovery current is connected in parallel.

A means for solving the problem is to detect gate voltage and/or collector voltage of the power semiconductor switching element and change gate drive voltage in several stages based on the detected value.

4 Claims, 11 Drawing Sheets

SURGE VOLTAGE (RINGING VOLTAGE) (V)

FIG. 14

GATE DRIVE CIRCUIT WITH REDUCED SWITCHING LOSS AND NOISE

FIELD OF THE INVENTION

The present invention relates to a gate drive circuit for a power semiconductor module.

BACKGROUND OF THE INVENTION

Recently, silicon carbide (SiC) and gallium nitride (GaN) attract attention as wide-gap semiconductor elements. Those materials have high breakdown voltage strength which is ten times as high as that of Si, and a drift layer for ensuring breakdown voltage can become thinner to nearly one-tenth, thereby making it possible to reduce voltage when a power device is turned on. By doing so, even in a high breakdown voltage area which allows only bipolar elements to be used with regard to Si, unipolar elements can be used with regard to wide-gap semiconductor elements made of SiC and the like.

In a power semiconductor module used for an inverter circuit, a free wheeling diode is connected in parallel to a switching device. A Si-PiN diode is used as a free wheeling diode in a conventional power semiconductor module. The Si-PiN diode is a bipolar-type semiconductor element which is constructed such that voltage drop is reduced due to conductivity modulation when large forward-bias current is applied. However, the PiN diode has characteristics in that during the process from the forward bias state to the reverse bias state, a carrier which remains on the PiN diode due to conductivity modulation is turned into reverse recovery current. In a Si-PiN diode, reverse recovery current is large because life time of the remaining carrier is long. For this reason, there are problems in that the reverse recovery current increases turn-on loss and reverse recovery loss (Err) generated on the element at the time of the reverse recovery of the diode.

On the other hand, a schottky barrier diode (SBD) is a unipolar-type semiconductor element which generates almost no carriers due to conductivity modulation. Accordingly, when a schottky barrier diode is used for an inverter circuit, because reverse recovery current is very small, it is possible to keep the turn-on loss and the reverse recovery loss small. Since conventional Si has low breakdown field intensity, when an SBD is made with high breakdown voltage, high resistance is generated when electricity is applied. For this reason, the breakdown voltage of a Si-SBD is limited to approximately 200 V. However, because SiC has high breakdown field intensity ten times of that of Si, practical application of high breakdown voltage SBD becomes possible, and it is widely known that turn-on loss (Eon) and reverse recovery loss (Err) generated on the element at the time of the reverse recovery of the diode can be reduced.

Furthermore, in the main circuit of an inverter of a power module which uses a conventional Si-PiN diode, commutation surge voltage ($\Delta Vp = L \times$ reverse recovery di/dt) is added according to the product of the current change (reverse recovery di/dt) at the attenuation of reverse recovery current of a PiN diode and the main circuit inductance L. And, when the sum ($E + \Delta Vp$) of power supply voltage (E) and surge voltage ($\Delta Vp$) exceeds a breakdown voltage of the power semiconductor element, there is a possibility that the power semiconductor element may become broken. For this reason, various kinds of technologies to reduce inductance of the main circuit have been proposed.

Furthermore, in a gate drive circuit of a power semiconductor, it is well-known that gate resistance is made large in order to decrease current change (di/dt) at the attenuation of reverse recovery current of the PiN diode.

Non-patent literature: "The element marginal loss analysis method for high power density power converter by the Si-MOSFET/SiC-SBD pair" Reference by the Institute of Electrical Engineers of Japan, Oct. 27, 2005, Electronic device and semiconductor power converter joint study group EDD-05-46 (SPC-05-71)

DISCLOSURE OF INVENTION

Problems to be Solved by the Invention

As stated above, a schottky barrier diode made of SiC (SiC-SBD) has very small reverse recovery current; therefore, turn-on loss and reverse recovery loss are essentially small. Furthermore, if reverse recovery di/dt can be made small, it is possible to further reduce gate resistance of a power semiconductor switching element and increase switching speed (turn-on speed) of the power switching element; consequently, power loss can be further reduced.

However, because a SiC-SBD has junction capacitance in some degree, if switching speed of the power switching element is increased, reverse recovery di/dt increases, thereby increasing surge voltage (ringing voltage). For this reason, there are problems in that switching loss of the power semiconductor element increases, and ringing noise also increases. That is, it is very difficult to simultaneously reduce both the switching power loss and noise by using a SiC-SBD.

In view of circumstances, the present invention provides a gate drive circuit which makes it possible to simultaneously reduce both switching loss of the power semiconductor element and noise.

Means for Solving the Problems

To solve the above problem, a gate drive circuit for a voltage drive-type power semiconductor switching element according to a preferred embodiment of the present invention is a gate drive circuit for driving a power semiconductor switching element to which a free wheeling diode having small reverse recovery current, such as a wide-gap semiconductor schottky barrier diode made of SiC or GaN, or a wide-gap semiconductor PiN diode, is connected; and the gate drive circuit detects a gate voltage value and a collector voltage value or a drain voltage value of the power semiconductor switching element and changes gate drive resistance or drive current based on the detected value. The change of the gate drive resistance or the drive current is controlled, for example, in two steps (resistance value small to large) or in three steps (resistance value small to large to small) by turning on and off the PMOS switching element.

That is, a gate drive circuit according to a preferred embodiment of the present invention is a gate drive circuit for driving a power semiconductor switching element to which a wide-gap semiconductor schottky barrier diode or a wide-gap semiconductor free wheeling diode is connected, and the gate drive circuit comprises an element voltage detection means for detecting a voltage value of the power semiconductor switching element, and a drive control means for changing gate drive resistance or drive current based on the voltage value detected by the element voltage detection means. And, in a specific embodiment, the element voltage detection means detects whether the gate voltage value of the power semiconductor switching element has become a prescribed voltage value or not, and the drive control means changes the gate drive resistance or drive current based on the detected gate voltage value. Moreover, the detected prescribed gate voltage value is equal to or less than the threshold voltage (hereafter, simply referred to as "threshold") for turning on the power semiconductor switching element.

Furthermore, the element voltage detection means detects whether a collector voltage value or a drain voltage value of the power semiconductor switching element has become a prescribed voltage value, and the drive control means may change the gate drive resistance or drive current based on the detected collector voltage value or the drain voltage value. In this case, the detected collector voltage value or the drain voltage value is equal to or less than the drive voltage of the gate drive circuit.

Furthermore, a gate drive circuit according to a preferred embodiment of the present invention is a gate drive circuit for driving a power semiconductor switching element to which a wide-gap semiconductor schottky barrier diode or a wide-gap semiconductor free wheeling diode is connected, and the gate drive circuit comprises a gate voltage detection means for detecting a gate voltage value of the power semiconductor switching element, a one-shot pulse generation means for generating one-shot pulse based on the gate voltage value detected by the element voltage detection means, and a drive control means for changing the gate drive resistance value from a first resistance value to a second resistance value which is greater than the first resistance value during the one-shot pulse generation period and returning the gate drive resistance value to the first resistance value after the one-shot pulse period has been finished. Herein, the drive control means changes the gate drive resistance value by turning on the PMOS switching element only during the one-shot pulse generation period. Moreover, the one-shot pulse generation period is between 100 ns and 2000 ns.

Furthermore, a gate drive circuit according to a preferred embodiment of the present invention is a gate drive circuit for driving a power semiconductor switching element to which a wide-gap semiconductor schottky barrier diode or a wide-gap semiconductor free wheeling diode is connected, and the gate drive circuit comprises a speed-up capacitor for charging at high speed when the gate drive circuit is turned on, a gate voltage detection means for detecting a gate voltage value of the power semiconductor switching element, and a switching means which turns on and off in response to a gate voltage value detected by the gate voltage detection means, wherein a gate drive resistance value of the power semiconductor switching element becomes a first resistance value during the speed-up capacitor charging period, and after the speed-up capacitor has been charged, the gate drive resistance value becomes a second resistance value which is greater than the first resistance value, and when the gate voltage detection means detects a gate voltage value which is equal to or less than the threshold, the switching means turns on and the gate drive resistance value becomes the first resistance value again.

More characteristics of the present invention will be clearly described by the best mode for carrying out the invention, described below, and the attached drawings.

EFFECTS OF THE INVENTION

According to the preferred embodiments of the present invention, a switching loss of the power semiconductor element can be reduced while noise is also reduced. That is, it is possible to simultaneously reduce both switching power loss and noise.

LEGEND 31,33 Si-IGBT
32,34 SiC-SBD
41-43 Gate resistor
44 npn transistor
45 pnp transistor
46 Gate resistance switching PMOS
51 Drive/logic circuit
52 Gate voltage detection circuit
53 One-shot pulse generation circuit
56 Lower-side drive/protection circuit
57 Upper-side drive/protection circuit
66 Main circuit power supply
67 Main circuit inductance
71 High breakdown voltage diode
72 Diode
73 Resistor
74 Collector voltage detection circuit
81 Comparator
82 Reference voltage for gate voltage comparison
83 Inverter
84 NOR circuit 85 Resistor
86 Capacitor

BEST MODE FOR CARRYING OUT THE INVENTION

To put it briefly, the present invention relates to a gate drive circuit for a power semiconductor module in which a free wheeling diode having small reverse recovery current, such as a wide-gap semiconductor schottky barrier diode made of SiC or GaN or a wide-gap semiconductor PiN diode, is connected in parallel to a power semiconductor switching element.

<Presupposition>

Prior to a description of each embodiment, a general gate drive circuit will be explained for a better understanding of the present invention.

Figure 1:
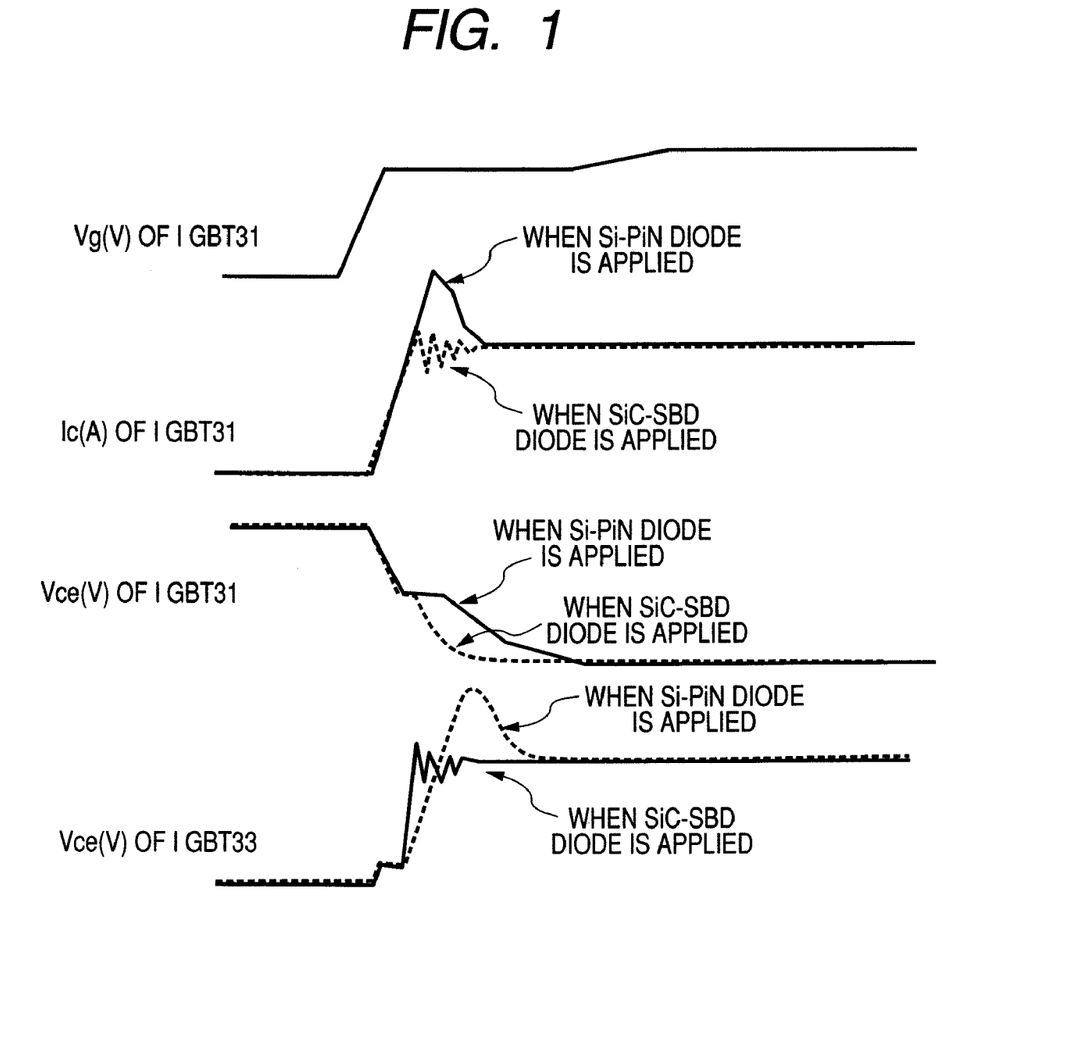
FIG. 1 shows the voltage and current waveform in the case in which a Si-PiN diode and a SiC-SBD are used.

FIG. 1 shows the voltage and current waveform of a lower IGBT 31 and an upper IGBT 33 connected in series in a case in which a conventional Si-PiN diode is used and in another case in which a SiC-SBD is used. In the case in which a conventional Si-PiN diode is used, reverse recovery current is generated due to a carrier that remains on the upper Si-PiN diode. The reverse recovery current delays the voltage drop of the IGBT 31, increasing turn-on loss (Eon). Furthermore, as shown in Vce waveform of the IGBT 33, surge voltage, indicated by the broken line, which is generated on the element when the upper Si-PiN diode is reversely recovered, increases. If the surge voltage exceeds breakdown voltage of the power semiconductor switching element, there is a possibility that the power semiconductor element may become broken.

As state in the paragraph of Background Art, because a SIC-SBD has very small reverse recovery current, turn-on power loss and reverse recovery loss are essentially small. Furthermore, if reverse recovery di/dt can be made small, it is possible to further reduce gate resistance of a power semiconductor switching element and increase switching speed (turn-on speed) of the power switching element; consequently, switching loss can be further reduced. However, since a SiC-SBD has junction capacitance in some degree, if switching speed of the power switching element is increased, reverse recovery di/dt also increases, thereby increasing surge voltage (ringing voltage), and there are problems in that ringing noise also increases.

Each preferred embodiment of the present invention solves the problems with ordinary gate drive circuits. Hereafter, each embodiment will be described in detail with reference to the attached drawings.

First Embodiment

Figure 2:
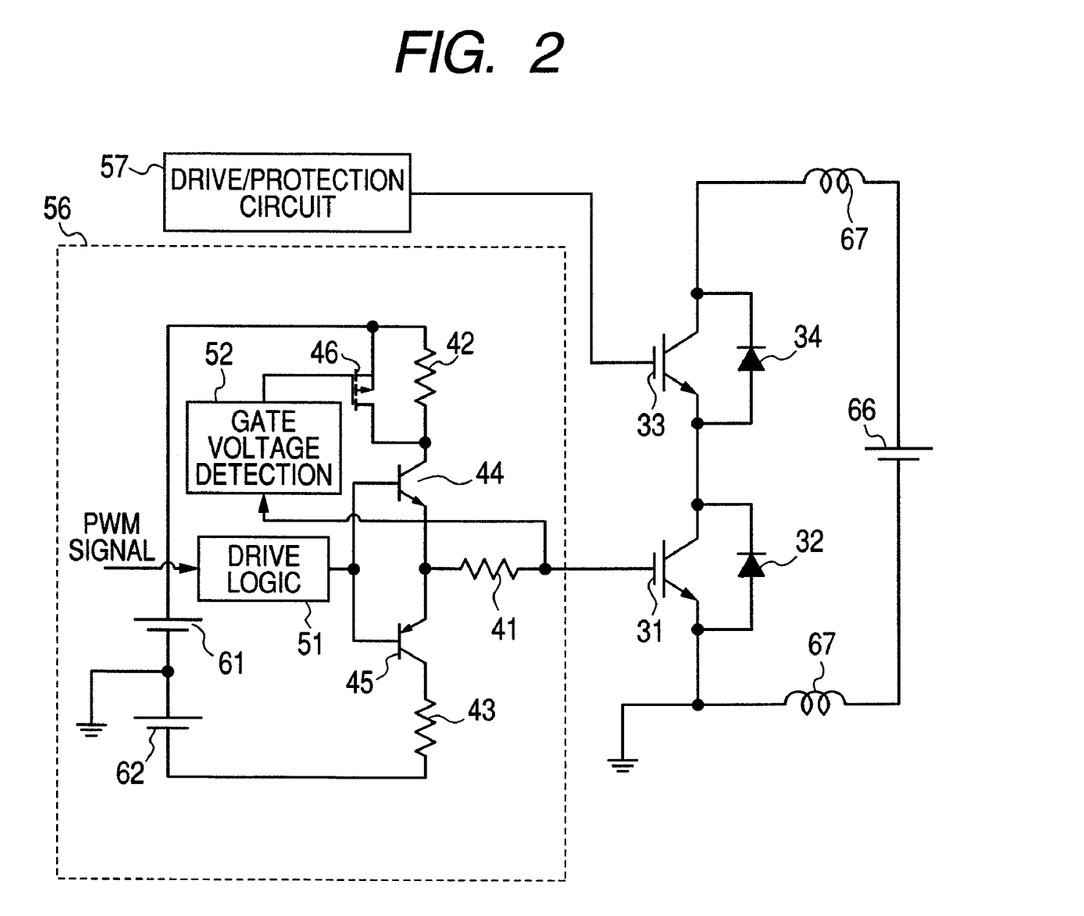
FIG. 2 shows the configuration of a drive circuit of a power semiconductor element according to a first embodiment of the present invention.

FIG. 2 shows the configuration of a drive circuit of a power semiconductor element according to a first embodiment of the present invention. The first embodiment relates to a drive circuit which changes gate resistance in two stages.

The main circuit of an inverter, located on the right in the drawing, comprises lower Si-IGBT 31 and SIC-SBD 32, upper Si-IGBT 33 and SiC-SBD 34, and a main circuit power supply 66. The main circuit's Si-IGBTs 31 and 33 are connected to a lower-side drive/protection circuit 56 and an upper-side drive/protection circuit 57 which drive those Si-IGBTs. In FIG. 2, the detailed configuration of the lower-side drive/protection circuit 56 is shown encircled by the broken line, and the upper-side drive/protection circuit 57 has the same configuration; therefore, the detail is omitted.

The drive/protection circuit 56 of this embodiment newly comprises a gate voltage detection circuit 52 and a gate resistance switching PMOS 46 in addition to gate resistors 41, 42, 43, an npn transistor 44, and an pnp transistor 45, which are components of a conventional gate drive circuit. The pnp transistor 44 and the npn transistor 45 can be substituted by a PMOS and a NMOS. The gate drive circuit of this embodiment controls by switching gate resistance in the case in which a free wheeling diode having small reverse recovery current, such as a SiC-SBD, is used.

Figure 3:
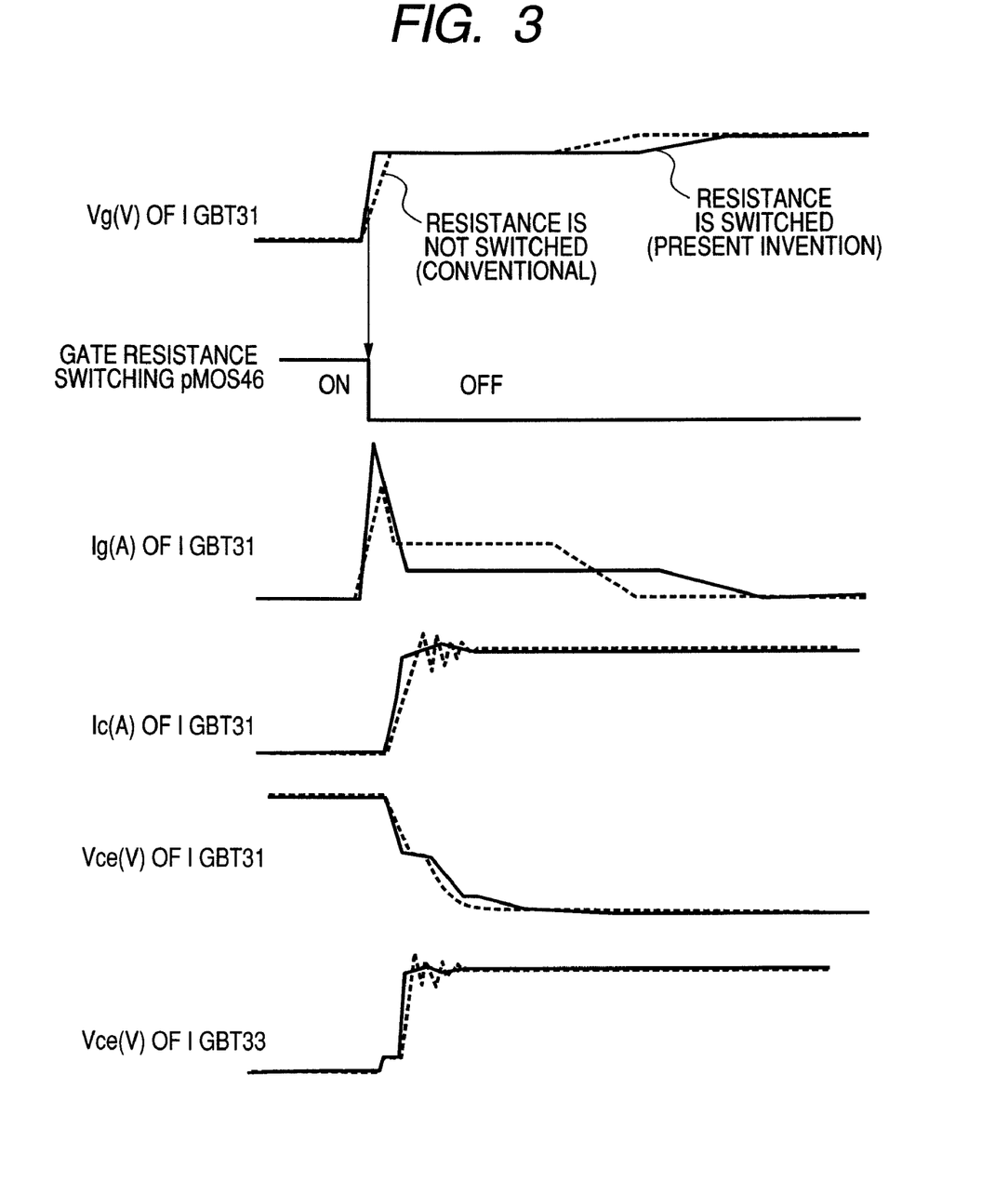
FIG. 3 shows the voltage and current waveform of the lower and upper IGBTs in the case in which a first embodiment of the present invention is applied.

Next, operation of the drive/protection circuit 56 according to a first embodiment will be described with reference to FIG. 3. FIG. 3 shows the voltage and current waveform of the lower IGBT 31 and the upper IGBT 33 that changes over time. The gate voltage detection circuit 52 for detecting gate voltage of the IGBT 31 detects gate voltage at a smaller value than the threshold voltage of the IGBT 31 and transmits a signal to turn off the PMOS 46 which is currently turned on. Because the PMOS 46 is initially in the ON state, current passes through the PMOS 46 without flowing through the resistor 42 and the IGBT 31 operates by a gate resistor 41. At the time gate voltage has exceeded the threshold, the PMOS 46 is turned off, current flows through the resistor 42, and the IGBT 31 operates according to the sum of the gate resistor 41 and the gate resistor 42. Therefore, the turn-on initial current change rate (di/dt) can be increased, while it is possible to moderately control the current change rate in the middle because gate resistance is increased in the middle. Furthermore, since a SiC-SBD has junction capacitance in some degree, it is possible to reduce surge voltage (ringing voltage) by moderately controlling reverse recovery di/dt. Moreover, it is easy to detect gate voltage by using a circuit which uses a comparator as a gate voltage detection circuit 52.

Moreover, it is possible to recover operation delay time and drive a switching element with appropriate timing by setting a detected gate voltage value of the gate voltage detection circuit 52 at a value lower than the threshold voltage of the switching element (IGBT).

Thus, according to this embodiment, it is possible to reduce turn-on loss of the element and reverse recovery loss of the diode by increasing initial switching speed, and it is also possible to reduce noise due to ringing or the like by moderately controlling the current change rate in the middle of the operation.

Second Embodiment

Figure 4:
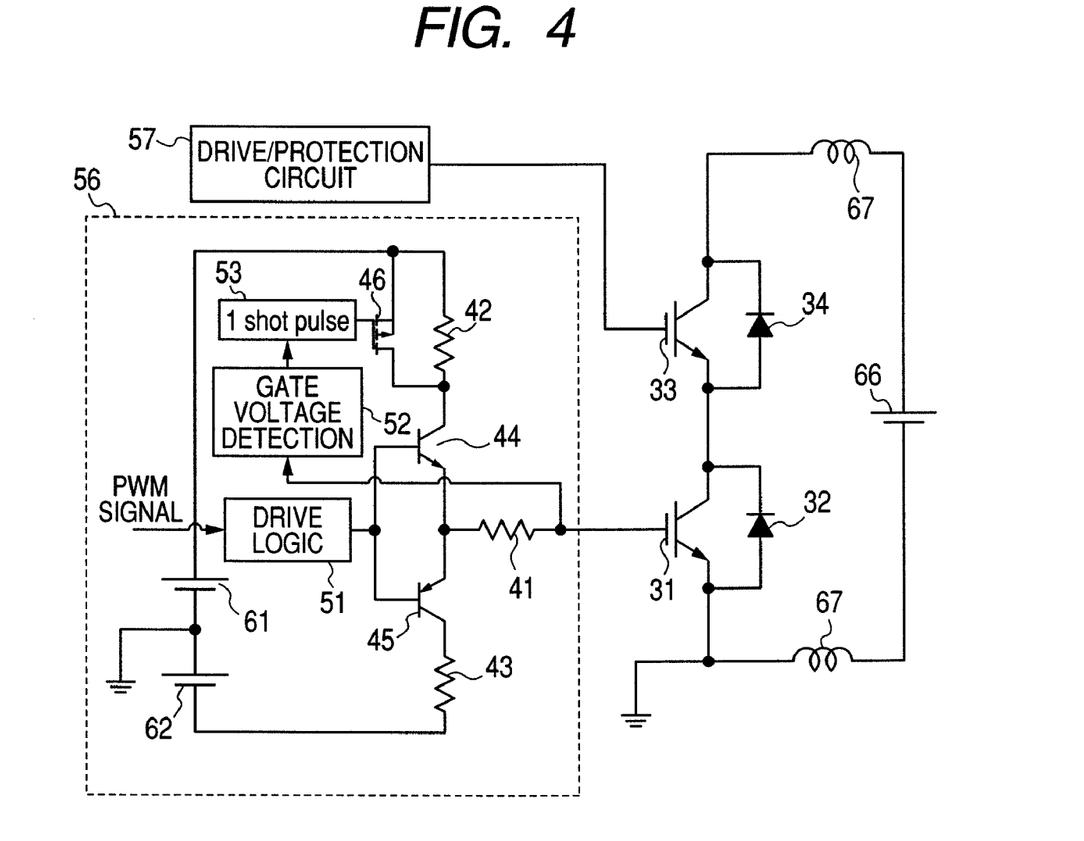
FIG. 4 shows the configuration of a drive circuit of a power semiconductor element according to a second embodiment of the present invention.

FIG. 4 is a block diagram of a drive circuit of a power semiconductor element according to a second embodiment of the present invention. In the drawing, the same symbol is used for the same component as that of a first embodiment. The difference between this embodiment and the first embodiment shown in FIG. 2 is that this embodiment is equipped with a one-shot pulse generation circuit 53 which inputs the output of a gate voltage detection circuit so as to change gate resistance in three stages.

Figure 5:
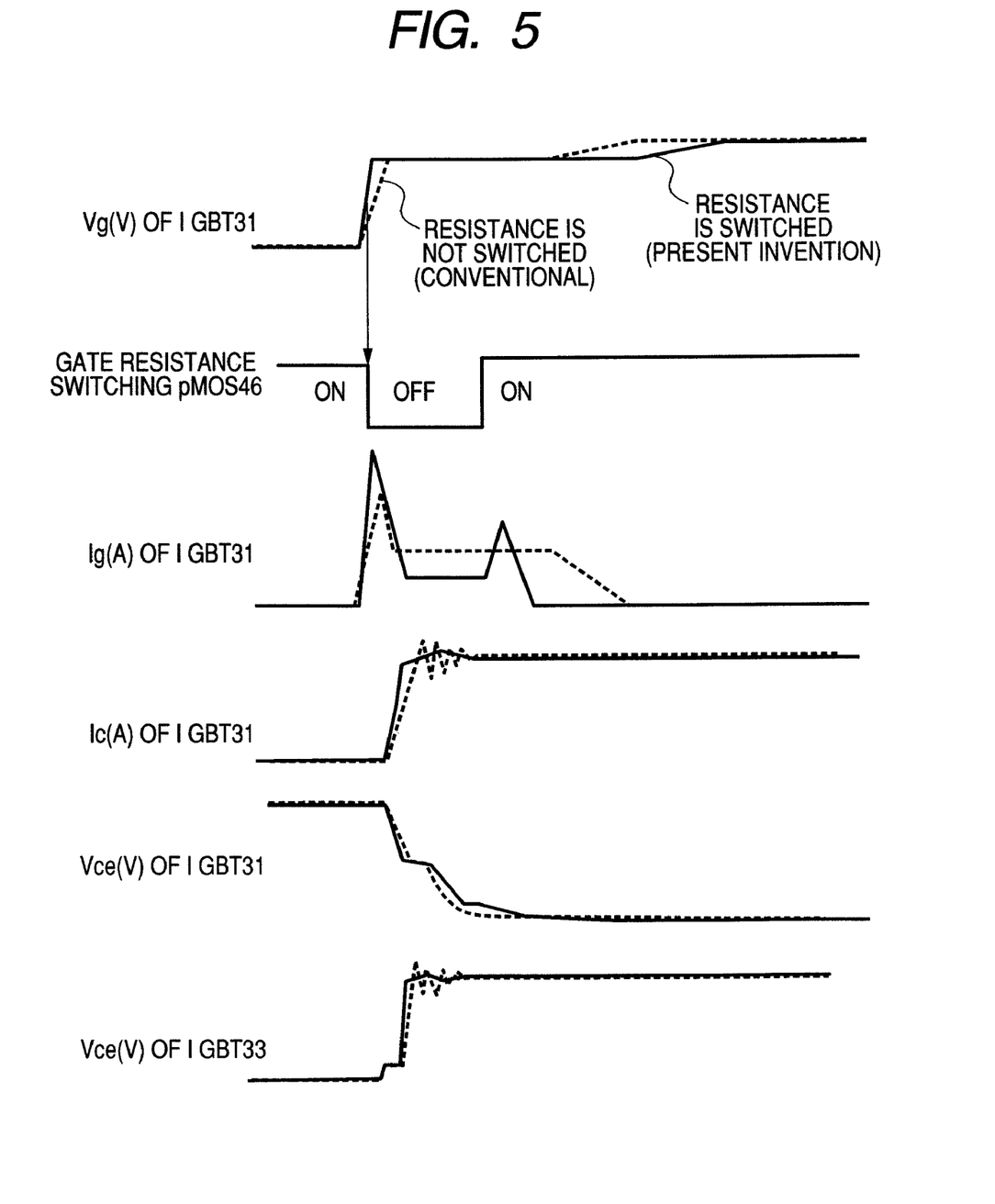
FIG. 5 shows the voltage and current waveform of the lower and upper IGBTs in the case in which a second embodiment of the present invention is applied.

Next, operation of a drive/protection circuit 56 according to a second embodiment will be described with reference to FIG. 5. FIG. 5 shows the voltage and current waveform of the lower IGBT 31 and the upper IGBT 33 which changes over time. In the drive/protection circuit 56 according to this embodiment, a one-shot pulse generation circuit 53 is added, and control is executed (resistance: small to large to small) so that gate resistance is increased for a constant period of time. Since it is possible to quickly reduce collector current of the IGBT 31 by eventually reducing gate resistance, it is possible to further reduce turn-on loss of the switching element. Moreover, the period of one-shot pulse is determined according to the junction capacitance of the element (IGBT) and characteristics of the element, and it is desirable that the period be between 100 ns and 2000 ns. By changing the period of one-shot pulse, it is possible to cope with various scales of elements (IGBT).

Figure 6:
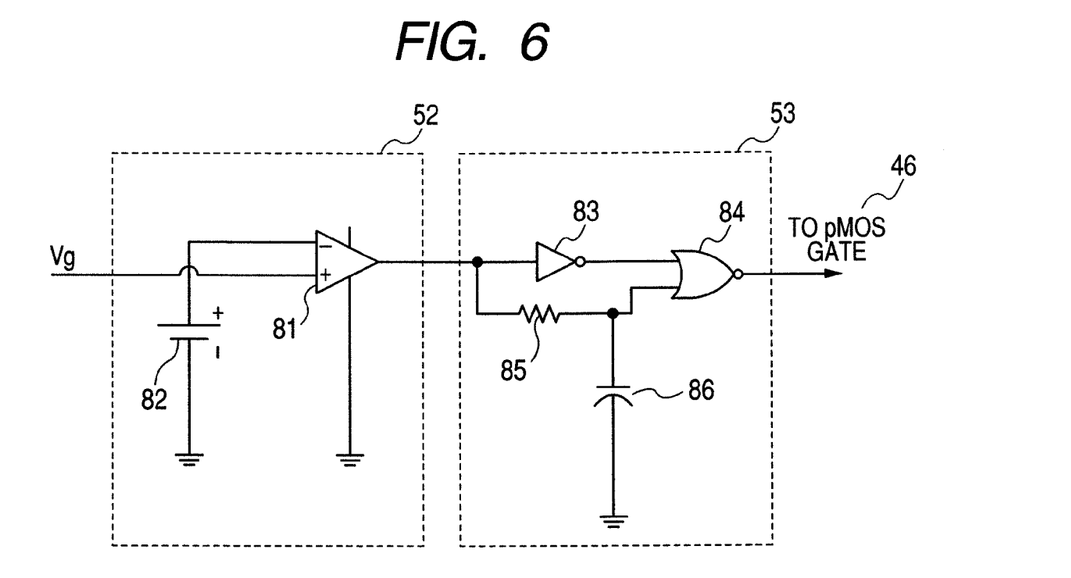
FIG. 6 shows the detailed configuration of a gate voltage detection circuit 52 and a one-shot pulse generation circuit 53 in the drive circuit of a power semiconductor element according to a second embodiment of the present invention.

FIG. 6 shows the detailed configuration of a gate detection circuit 52 and a one-shot pulse circuit 53 in the drive circuit of the power semiconductor element according to a second embodiment of the present invention. The gate detection circuit 52 of the drive circuit comprises a comparator 81 and a reference voltage for gate voltage comparison 82. The one-shot pulse circuit 53 comprises an inverter 83, a NOR circuit 84, a resistor 85 for time constant creation, and a capacitor 86.

Figure 7:
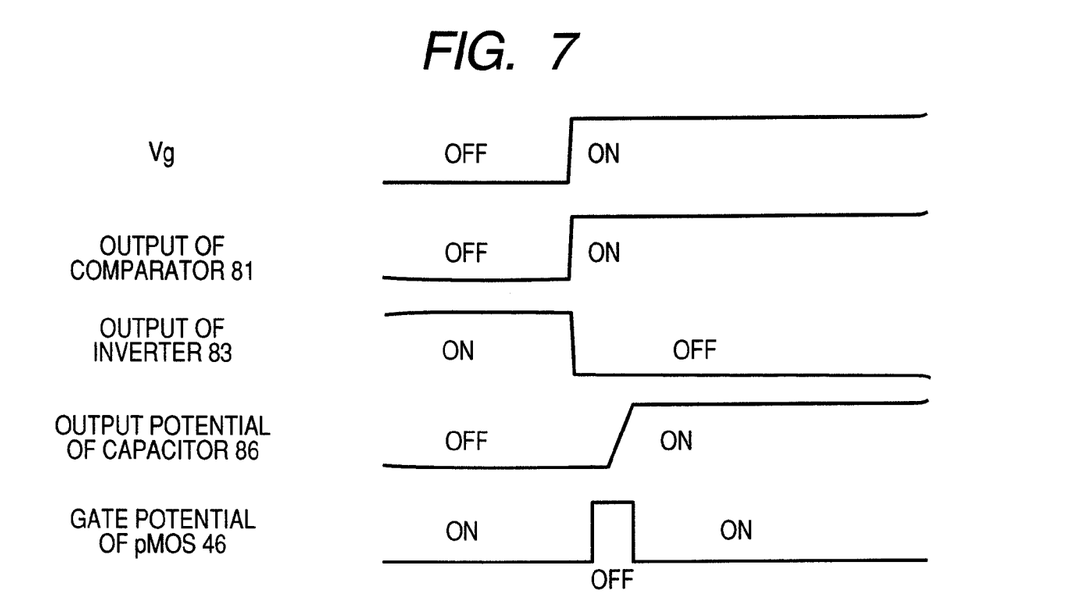
FIG. 7 shows the operation waveform of a one-shot pulse circuit.

FIG. 7 shows the operation waveform of the one-shot pulse circuit 53 shown in FIG. 6. By the excess of the gate voltage Vg over the reference voltage for gate voltage comparison 82, it is possible to turn off the gate of the PMOS for the period of time constant which is determined by the product of the resistance of 85 and the capacitance of 86 for time constant creation, thereby increasing gate resistance during that time constant period.

Thus, by controlling the magnitude of gate resistance, it is possible to reduce noise caused by ringing or the like while reducing turn-on loss of the element and reverse recovery loss of the diode.

Third Embodiment

Figure 8:
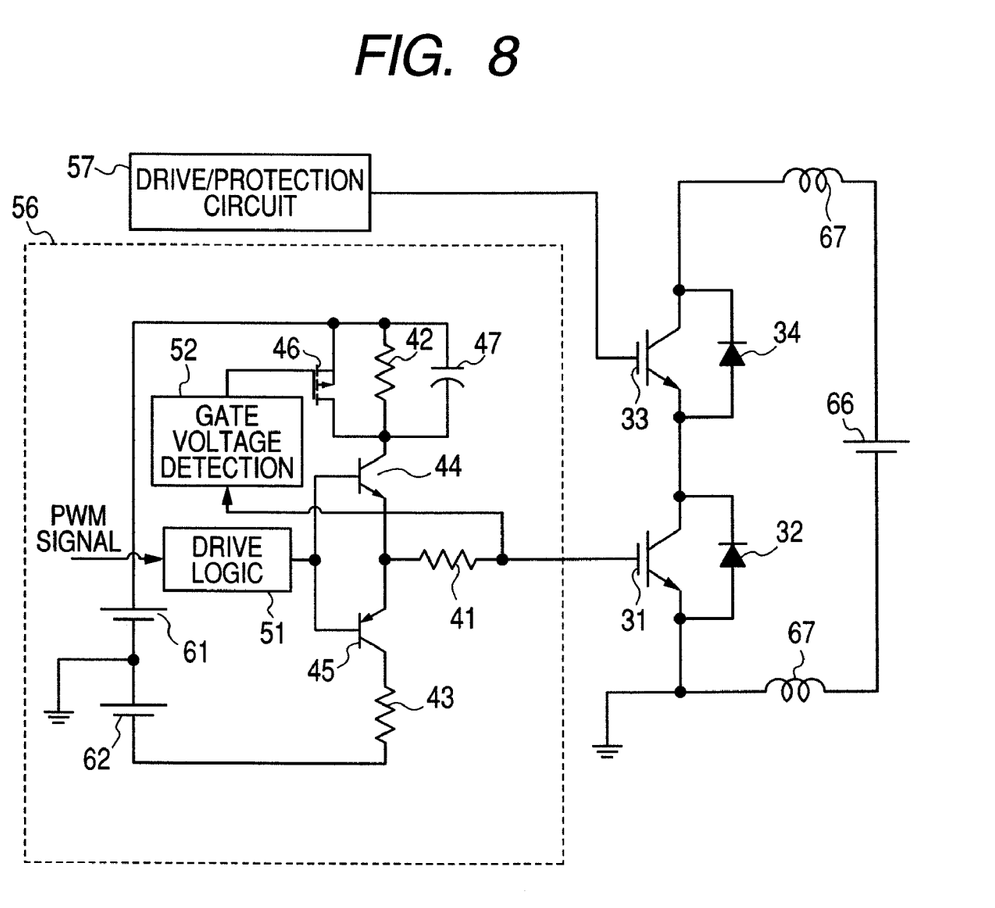
FIG. 8 shows the configuration of a drive circuit of a power semiconductor element according to a third embodiment of the present invention.

FIG. 8 shows the configuration of a drive circuit of a power semiconductor element according to a third embodiment of the present invention. The same symbol is used for the same component as that of a first embodiment. The difference between this embodiment and a second embodiment shown in FIG. 4 is that a speed-up capacitor 47 is added to this embodiment instead of providing a one-shot pulse generation circuit 53. The drive circuit according to a third embodiment changes gate resistance in three stages in the same manner as the second embodiment.

Figure 9:
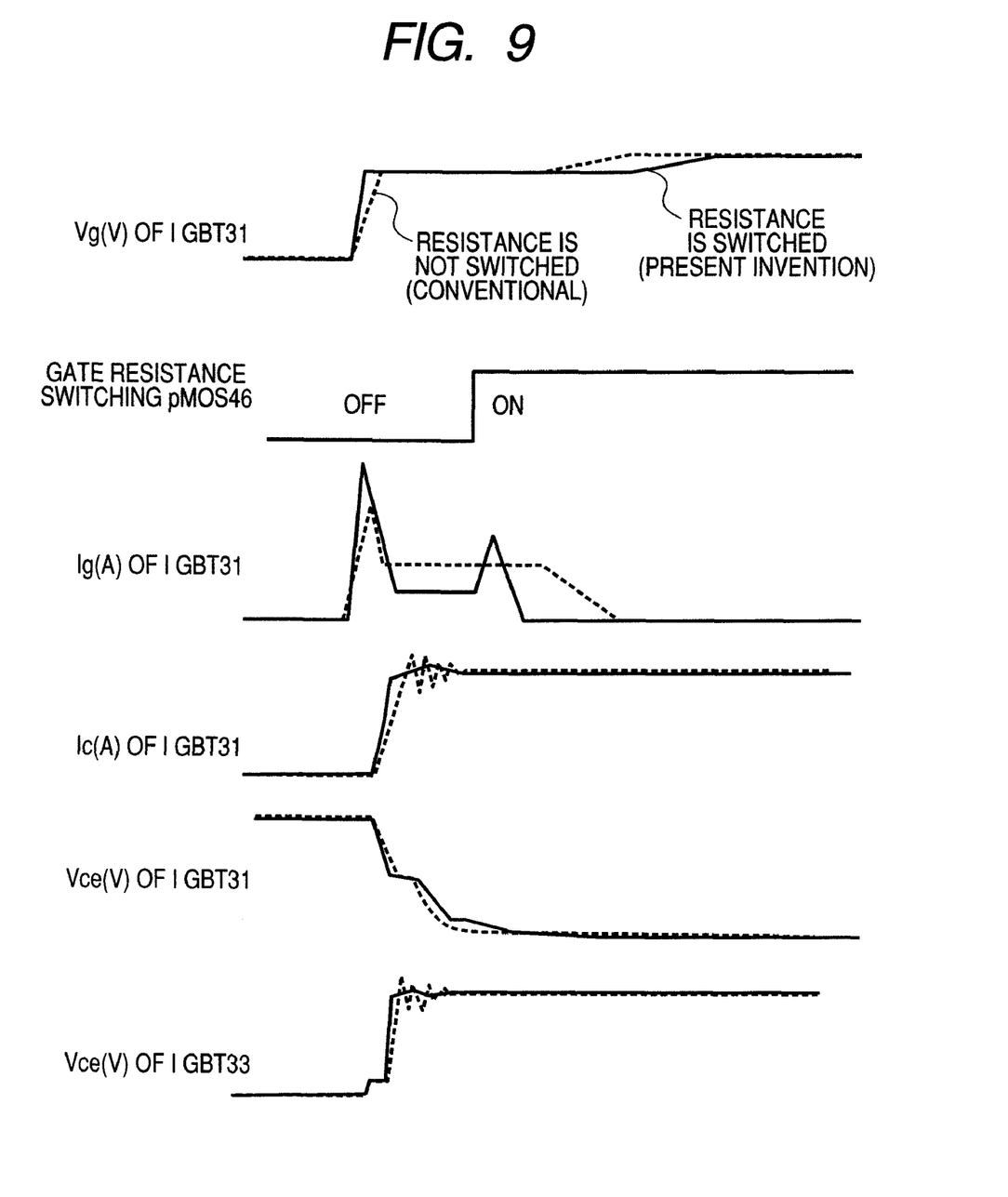
FIG. 9 shows the voltage and current waveform of the lower and upper IGBTs in the case in which a third embodiment of the present invention is applied.

Next, operation of a drive/protection circuit 56 according to a third embodiment will be explained with reference to FIG. 9. FIG. 9 shows the voltage and current waveform of the lower IGBT 31 and the upper IGBT which changes over time. A speed-up capacitor 47 is added to a circuit of this embodiment to increase gate charging current when the power is initially turned on. That is, when the power is initially turned on, the PMOS 46 is turned off and current flows through the speed-up capacitor 47 instead of flowing through the resistor 42. At that time, the IGBT 31 operates according to the resistor 41. And, when high-speed charge of the speed-up capacitor 47 has been finished, current flows through the resistor 42; accordingly, at this point in time, the IGBT 31 operates according to the sum of the resistor 41 and resistor 42. Furthermore, when the gate voltage detection circuit 52 detects a voltage which is equal to or less than the threshold voltage of the IGBT, by eventually reducing gate resistance (resistor 41+42 to resistor 41), collector current of the IGBT 31 can be quickly reduced; consequently, it is possible to further reduce turn-on loss of the switching element.

Thus, according to this embodiment, it is possible to reduce noise caused by ringing or the like while reducing turn-on loss of the element and reverse recovery loss of the diode.

Fourth Embodiment

Figure 10:
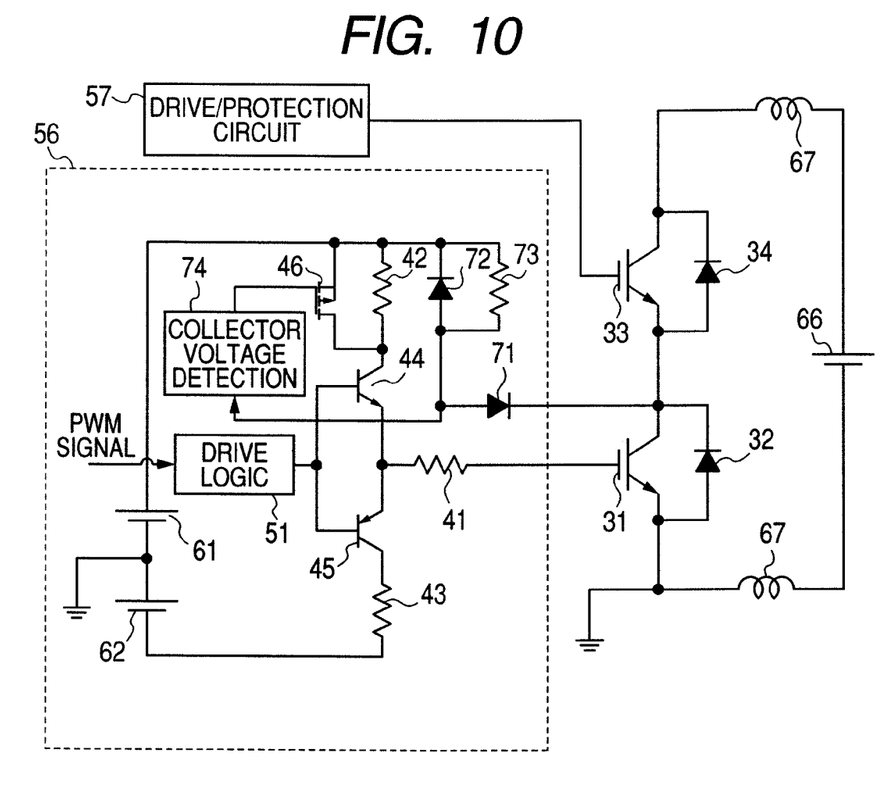
FIG. 10 shows the configuration of a drive circuit of a power semiconductor element according to a fourth embodiment of the present invention.

FIG. 10 shows the configuration of a drive circuit of a power semiconductor element according to a fourth embodiment of the present invention. The same symbol is used for the same component as that of a first embodiment. The difference between this embodiment and a first embodiment shown in FIG. 1 is that a collector voltage detection circuit 74 is provided instead of a gate voltage detection circuit 52.

The collector voltage detection circuit 74 comprises a high-breakdown voltage diode 71, a diode 72 connected to the power supply, and a resistor 73 in order to detect collector voltage. The same effect as that of a first embodiment can be obtained by changing gate resistance by detecting collector voltage instead of detecting gate voltage.

Moreover, to prevent wrong operation, by detecting both gate voltage and collector voltage thereby controlling gate resistance, it is possible to reliably reduce noise caused by ringing or the like while reducing turn-on loss of the element and reverse recovery loss of the diode.

<Comparison of Technological Effects Between the Present Invention and Conventional Technology>

Figure 11:
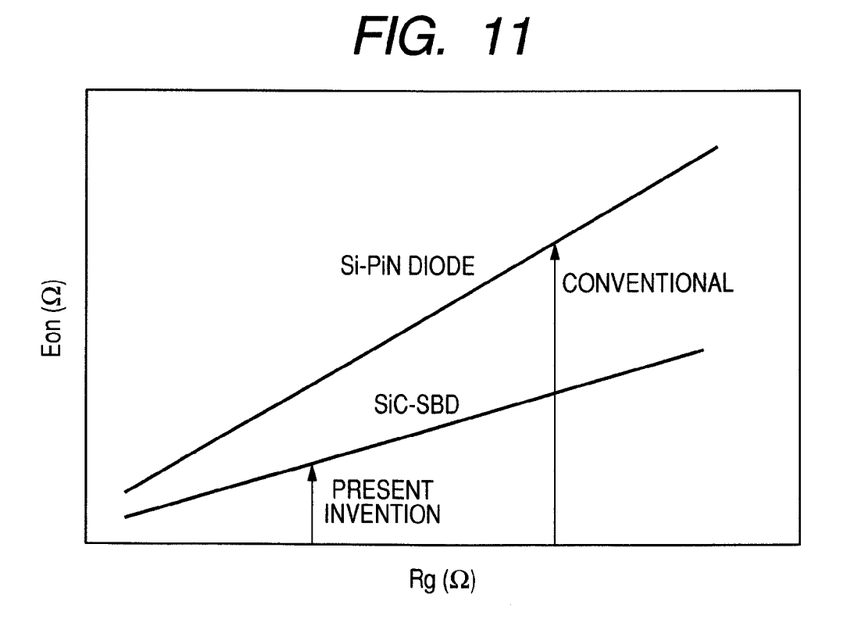
FIG. 11 is a comparison drawing in which turn-on loss of each embodiment of the present invention is compared with that of the conventional technology.
Figure 12:
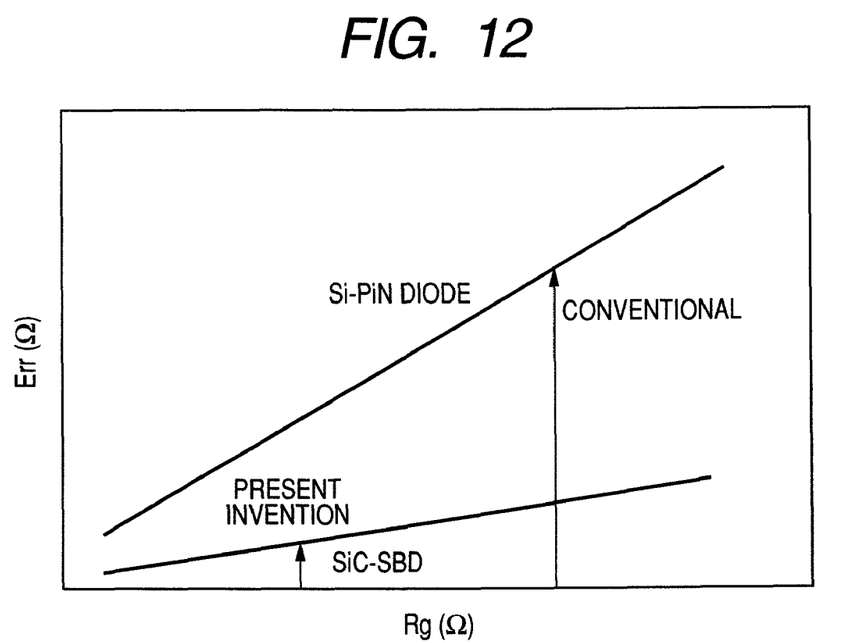
FIG. 12 is a comparison drawing in which reverse recovery loss of the diode of each embodiment of the present invention is compared with that of the conventional technology.

FIG. 11 shows the comparison of turn-on power loss between the conventional technology and each embodiment, and FIG. 12 shows the comparison of reverse recovery loss of the diode between the conventional technology and each embodiment. When using a SiC-SBD, because the SiC-SBD has smaller reverse recovery current than that of a Si-PiN diode which has the same gate resistance value, it is possible to reduce turn-on power loss (Eon) to nearly one half and recovery loss (Err) of a diode to nearly one fifth. This reveals that the use of the circuit according to this embodiment makes it possible to reduce ringing, thereby reducing gate resistance to one half of that of the conventional technology.

Figure 13:
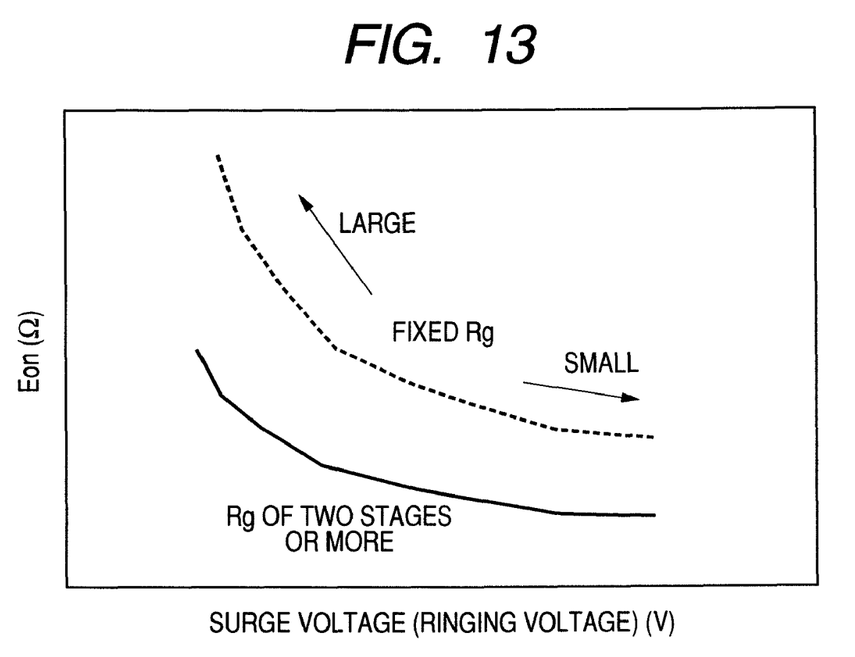
FIG. 13 shows the trade-off comparison between recovery voltage and turn-on loss when each embodiment of the present invention is applied.
Figure 14:
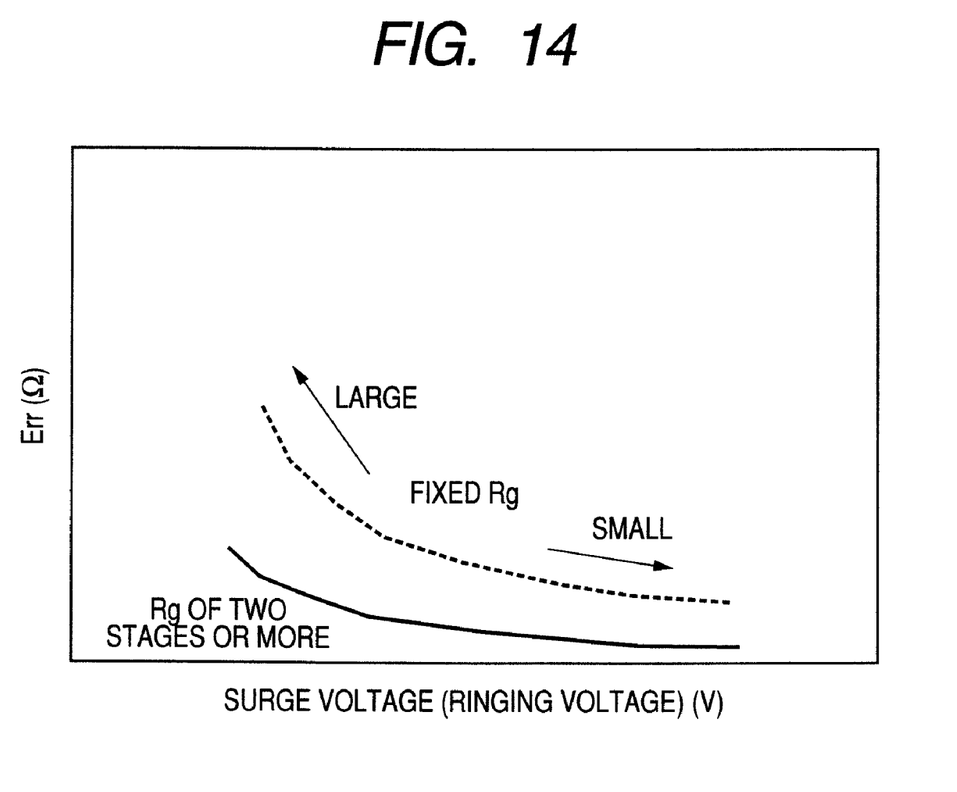
FIG. 14 shows the trade-off comparison between recovery voltage and reverse recovery loss when each embodiment of the present invention is applied.

Furthermore, FIG. 13 shows the relationship between surge voltage (ringing voltage) and turn-on loss (Eon) in each embodiment, and FIG. 14 shows the relationship between surge voltage (ringing voltage) and reverse recovery loss (Err) in each embodiment. As shown in FIG. 13, when compared to a case in which a conventional fixed Rg is used, in the case in which gate resistance of two or more stages is used as shown in this embodiment, trade-off between surge voltage (ringing voltage) and turn-on power loss (Eon) can be improved. In the same manner, as shown in FIG. 14, when compared to a case in which a conventional fixed Rg is used, in the case in which gate resistance of two or more stages is used as shown in this embodiment, trade-off between surge voltage (ringing voltage) and reverse recovery loss (Err) can be improved.

In each embodiment of the present invention, although a Si-IGBT is described as a switching element, a MOSFET in the case of Si, and a MOSFET, junction FET, and a bipolar transistor in the case of SiC may be used as a switching element. Furthermore, although a SiC-SBD is described as a diode connected in parallel, the same effects can be obtained by applying diode, such as a wide-gap semiconductor SBD made of GaN, diamond or the like, a PiN diode, and an MPS (Merged Schottkey Barrier) structured diode which combines SBD and PiN diode.

CONCLUSION

The present invention relates to a gate drive circuit for driving a power semiconductor switching element to which a wide-gap semiconductor schottky barrier diode or a wide-gap semiconductor free wheeling diode is connected. In the gate drive circuit, a voltage value of the power semiconductor switching element is detected (monitored), and the gate drive resistance or drive current is changed based on the detected voltage value. Accordingly, by increasing initial-stage switching speed thereby reducing turn-on loss of the element and reverse recovery loss of the diode and moderately controlling the current change rate in the middle, it is possible to reduce noise caused by ringing or the like.

Voltage of the power semiconductor switching element to be monitored may be gate voltage, collector voltage, or drain voltage. Moreover, although a word "collector voltage" is used for an IGBT, a word "drain voltage" is used for a MOSFET; herein, both the "collector voltage" and the "drain voltage" are used in the same meaning.

Furthermore, by keeping the detected prescribed gate voltage value equal to or less than the threshold voltage of the power semiconductor switching element (for example, IGBT), it is possible to properly absorb operation delay time, thereby enabling the control of the operation of the gate drive circuit.

Furthermore, it is possible to control gate resistance so that the gate resistance changes in two stages from a first resistance value to a second resistance value which is larger than the first resistance value; and furthermore, it is also possible to control gate resistance so that the gate resistance changes in three stages from a first resistance value to a second resistance value which is larger than the first resistance value, and then returns to the first resistance value after a prescribed period of time has passed. However, the three-staged control method can drive an IGBT more accurately and is more effective with regard to the reduction of switching loss of the power semiconductor switching element and the reduction of noise.

A gate drive circuit according to the above-mentioned second embodiment detects a gate voltage value of the power semiconductor switching element and generates one-shot pulse based on the detected gate voltage value. And, the value of the gate drive resistance is changed from a first resistance value to a second resistance value which is larger than the first resistance value during the one-shot pulse generation period and then returns to the first resistance value after the one-shot pulse period has been finished, thereby controlling gate resistance in three stages as mentioned above. By doing so, simple configuration can be achieved which can reduce switching loss of the power semiconductor switching element while reducing noise. Moreover, by setting the one-shot pulse generation period between 100 ns and 2000 ns, it is possible to cope with various scales (voltage current capacity) of power semiconductor switching elements.

Furthermore, a gate drive circuit according to the above-mentioned third embodiment comprises a speed-up capacitor for charging at high speed when the gate drive circuit is turned on, a gate voltage detection circuit for detecting a gate voltage value of the power semiconductor switching element, and a switching means (PMOS) which turns on and off in response to the gate voltage value detected by the gate voltage detection circuit. And, the gate drive resistance value of the power semiconductor switching element (IGBT) becomes a first resistance value during the period of charging the speed-up capacitor, and after the charging of the speed-up capacitor has been finished, the value changes to a second resistance value which is larger than the first resistance value, then when the gate voltage detection circuit detects a gate voltage value which is equal to or less than the prescribed threshold voltage of the IGBT, the PMOS is turned on and the value changes to the first resistance value again. Since a speed-up capacitor is simply added, the simple configuration makes it possible to reduce switching power loss of the power semiconductor switching element and reduce noise.

As stated above, the present invention has been described; however, the present invention is not intended to be limited to the above-mentioned embodiments, and it will be obvious that various changes, additions, and substitutions can be made without departing from the scope of the invention.

What is claimed is:

1. A gate drive circuit for driving a power semiconductor switching element to which a wide-gap semiconductor Schottky barrier diode or a wide-gap semiconductor free wheeling diode is connected, the gate drive circuit comprising:
   an element voltage detection means for detecting a voltage value of the power semiconductor switching element, and
   a drive control means for changing gate drive resistance or drive current based on the voltage value detected by the element voltage detection means, wherein
   the element voltage detection means detects whether a collector voltage value or a drain voltage value of the power semiconductor switching element has become a prescribed voltage value, and
   the drive control means changes the gate drive resistance or drive current based on the detected collector voltage value or the drain voltage value.

2. A gate drive circuit according to claim 1, wherein the detected collector voltage value or the drain voltage value is equal to or less than the drive voltage of the gate drive circuit.

3. A gate drive circuit for driving a power semiconductor switching element to which a wide-gap semiconductor Schottky barrier diode or a wide-gap semiconductor free wheeling diode is connected, the gate drive circuit comprising:
   an element voltage detection means for detecting a voltage value of the power semiconductor switching element, and
   a drive control means for changing gate drive resistance or drive current based on the voltage value detected by the element voltage detection means, wherein
   the drive control means changes the gate resistance from a first resistance value to a second resistance value which is greater than the first resistance value.

4. A gate drive circuit for driving a power semiconductor switching element to which a wide-gap semiconductor Schottky barrier diode or a wide-gap semiconductor free wheeling diode is connected, the gate drive circuit comprising:
   an element voltage detection means for detecting a voltage value of the power semiconductor switching element, and
   a drive control means for changing gate drive resistance or drive current based on the voltage value detected by the element voltage detection means, wherein
   the drive control means changes the gate resistance from a first resistance value to a second resistance value which is greater than the first resistance value, and returns the gate resistance to the first resistance value after a prescribed period of time has passed.

* * * * *